United States Patent [19]

McBride et al.

[11] 4,026,759

[45] May 31, 1977

[54] METHOD OF MAKING INGROWN LEAD FRAME WITH STRAIN RELIEF

[75] Inventors: Donald Gene McBride, Binghamton; Philip Harold Pallady, Windsor, both of N.Y.

[73] Assignee: International Business Machines Corporation, Armonk, N.Y.

[22] Filed: Dec. 11, 1975

[21] Appl. No.: 639,952

[52] U.S. Cl. ................................ 156/632; 427/88; 29/591; 156/633; 361/400

[51] Int. Cl.² .......................................... B29C 17/08

[58] Field of Search ............. 317/101 CC, 101 CF; 29/580, 625, 591; 156/3, 8, 11, 17, 18, 630, 632, 633; 427/88-91; 96/36.2

[56] References Cited

UNITED STATES PATENTS

| | | |
|---|---|---|
| 3,647,585 | 3/1972 | Fritzinger et al. .................... 156/17 |
| 3,672,985 | 6/1972 | Nathanson et al. ............. 156/11 X |
| 3,925,880 | 12/1975 | Rosvold ............................. 96/36.2 |

Primary Examiner—William A. Powell
Attorney, Agent, or Firm—Cyril A. Krenzer

[57] ABSTRACT

A method for providing a large number of interconnections between a circuitizable wafer and a circuitizable substrate provides very fine line interconnections with built-in strain relief. A channel between the respective substrates is filled with a solvent soluble material which is applied in a manner such that a convex or concave shape is attained in the channel between the material. A sensitizer may be mixed with the solvent soluble material prior to its placement in the channel between the substrates, and then a photoresist is applied to the composite, exposed and developed, yielding the desired circuit configuration. Next, copper leads are additively electrolessly plated to the desired thickness in the exposed circuit areas. After the leads have been formed, the solvent soluble material is removed leaving curved, strain relief leads suspended in air with the two ends interconnecting the substrates.

6 Claims, 9 Drawing Figures

METHOD OF MAKING INGROWN LEAD FRAME WITH STRAIN RELIEF

BACKGROUND OF THE INVENTION

1. Field of the Invention

This invention relates to a method for providing high density, strain relief interconnections between two circuitized substrates.

2. Prior Art

With the advent of large scale integration and other related technologies, it has become increasingly important to be able to provide high density, fine line interconnection capabilities for interconnects between two or more substrates. This requirement is even more difficult, if the two substrates are relatively large and have different coefficients of expansion, which would necessitate that some strain relief capability be built into the configuration.

An early technique for minimizing the mechanical stresses obtained during chip joining is shown in the article entitled "Semiconductor Chip Joining" in the IBM Technical Disclosure Bulletin, Volume 10, No. 5, October 1967 at pages 657 and 658. This article describes the use of soluble standoffs in connection with preferred interconnection leads mounted on a decal type support and using either a solder reflow technique or a pressure joining to interconnect the electrodes. Following the interconnection, the support decal is removed and the solvent soluble material is dissolved leaving a flexible, bent interconnection which transmits less stress to the interconnected joints. This technique is satisfactory for low density, relatively wide interconnections that can be easily aligned, but does not readily yield itself to a high density, fine line interconnection technique. Furthermore, it requires that the interconnecting members be preformed prior to being applied between the two substrates.

U.S. Pat. No. 3,428,866 teaches the use of removable powdered material as a bridging material over which interconnections can be formed. This technique does permit, for example, the growing by electroless deposition of interconnections between adjacent substrates, but does not yield strain relieved interconnections. Furthermore, the use of the powdered material as a bridging material, limits the minimum size that can be obtained because of the inherent graininess of the bridging material.

Still other difficulties are encountered in providing such interconnections, such as for example by beam lead technology, in situations where the interconnecting technologies inherently develop relatively high heat. Certain technology processes, such as bubble memory and Josephson packages, preclude the use of temperatures approaching or exceeding 150° C. Individual bonding of preformed wires to make the interconnections in such applications is very costly and difficult to accomplish with a high degree of reliability.

OBJECTS AND SUMMARY OF THE INVENTION

It is, therefore, a principal object of this invention to provide a method for producing high density, fine line interconnections with strain relief which overcome the foregoing disadvantages of the prior art.

It is another object of this invention to provide a method for producing high density, fine line interconnections, which can be carried on in a relatively low temperature environment.

It is still another object of this invention to provide a method for producing high density, fine line interconnections with strain relief, which is both economical and can be implemented with a minimum effort using existing technologies.

According to one aspect of the invention, a solvent soluble material is placed in a channel between two substrates to be interconnected, the solvent soluble material inherently provides a surface which is curved, yet which will permit the development of a conductor pattern over it to provide the interconnections between the two substrates. After the leads have been defined, the solvent soluble material is removed using a suitable solvent, leaving the leads suspended in air between the two substrates, and the curvature of the leads provide the desired strain relief in the event that the two substrates have differing coefficients of expansion or are subjected to other nonuniform stresses.

The foregoing and other objects, features and advantages of the invention will become more apparent from the following description of the preferred embodiments of the invention, as illustrated in the accompanying drawings.

DETAILED DESCRIPTION OF THE PREFERRED EMBODIMENTS

Figure 1:
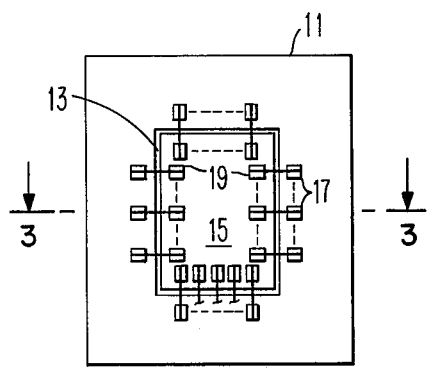
FIGS. 1 and 2 are perspective views of applications of circuit technology requiring high density, fine line interconnections.
Figure 3:
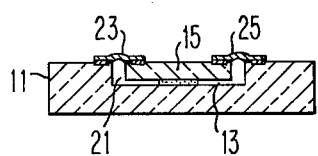
FIG. 3 is a sectional view taken along lines 3—3 of FIG. 1 to illustrate a desired interconnection.

Referring to FIG. 1, there is shown a particular application in which the present invention find utility. A large rectangular outer substrate 11 has a recess 13 in the central portion thereof in which is placed a second substrate 15, both substrates 11 and 15 being suitably circuitized or circuitizable and the object then is to provide interconnections between the pads 17 on substrate 11 and the respective pads 19 on substrate 15. According to the present invention, when the substrate 15 is placed in the recess 13 of substrate 11, a channel 21 exists between the substrate 11 and substrate 15 as best shown in FIG. 3. It is then desired to form interconnecting leads 23 and 25 between the pad locations on the respective substrates 11, 15.

Figure 2:
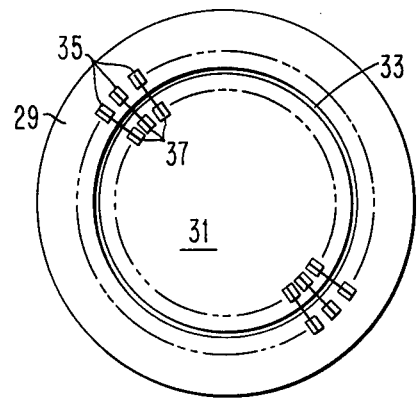

An alternate configuration utilizing the same principles according to the present invention is shown in FIG. 2. In this configuration, the substrates 29 and 31 are circular rather than rectangular. A channel 33 between the two substrates is formed when the substrate 31 is placed in a recess existing in substrate 29. The desired interconnections then must be made between the pad areas 35 on substrate 29 and pad areas 37 on substrate 31. It will be understood that the cross-section shown in FIG. 3 is just as applicable to the circular configurations of FIG. 2 as it is to the rectangular configurations of FIG. 1.

Figure 4A:
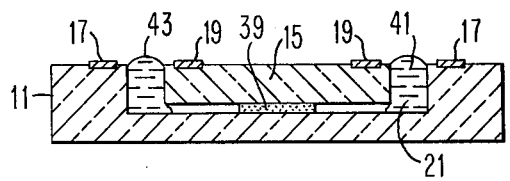
FIGS. 4A, 4B, 5A, 5B, 6A and 6B are sectional views illustrating the steps of the method for providing the desired interconnections between two substrates according to the present invention.
Figure 4B:
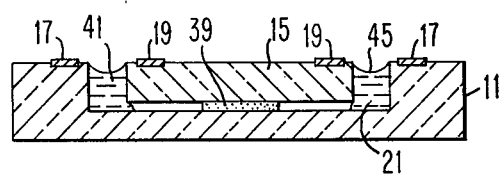

Referring next to FIGS. 4A and 4B, the substrate 15 is first affixed to the substrate 11 by a suitable bond 39 which may be a single point connection as indicated in the figures or could be multiple point connections. Next, a solvent soluble material 41 is placed in the gap 21 between the substrates 11 and 15. As shown in FIG. 4A, the solvent soluble material in the gap 21 is formed with a convex outer surface 43, whereas in FIG. 4B, the material 41 forms a concave outer surface 45 in the gap between the upper surfaces of the substrates 11 and 15. The placing of the solvent soluble material in the channel 41 is uniformly controlled to provide a reasonably smooth upper surface with the convex or concave "C" bent shape shown in FIGS. 4A and 4B, respectively. Next, the composite of the substrates with the solvent soluble material is metallized using any of the commonly known metallization processes. For example, the total composite could be sensitized and activated with $SnCl_2/PdCl_2$ and electroless or electroless/electrolytic plated copper is then placed over the composite. The interconnecting leads are then defined using photolithography and etching. Another approach is to use a palladium sensitizer mixed with the solvent soluble material prior to application of the solvent soluble material in the channel between the substrates. Then a suitable photoresist of approximately ½ mil thickness is applied, exposed and developed to define the appropriate interconnections between the pads 19 on substrate 15 and the pads 17 on substrate 11. Following the developing of the photoresist, copper leads are additively plated to the desired thickness in the patterned areas thereby defined.

Figure 5A:
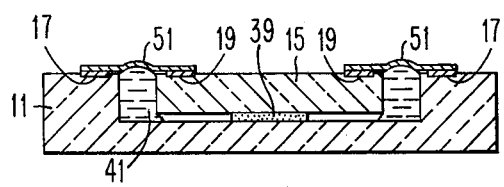
Figure 5B:
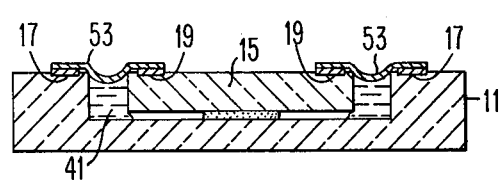
Figure 6A:
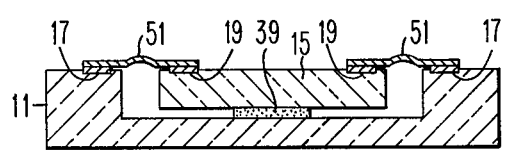
Figure 6B:
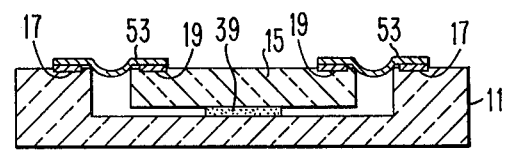

Then as shown in FIGS. 5A and 5B, the appropriate interconnecting leads are made between the pad areas 17 and 19, respectively. In FIG. 5A, the interconnecting leads 51 are convex, whereas in FIG. 5B, the interconnecting leads 53 are concave. Once these leads are suitably defined, the solvent soluble material 41 is removed using an appropriate solvent, such as methylene chloride or trichloroethylene, resulting in the C bent leads suspended in air between the two substrates as shown in FIGS. 6A and 6B. The C bent leads provide the appropriate strain relief to compensate for uneven expansions of the substrates 11 and 15 as the composite is exposed to varying environmental conditions. In addition, the C bent leads provide an inherently stronger interconnection between the pads 17 and 19 on the substrates 11 and 15, respectively.

Using the method of the present invention, it is possible to provide interconnecting leads 51, 53 as small as 1 to 2 mils in width with a thickness on the order of 0.5 to 1 mil. Generally, it is desirable to keep the line thickness to width ratio less than unity to maintain the strength of the interconnections.

In forming the solvent soluble bridge 43 or 45 of FIGS. 4A and 4B, respectively, it is important to properly select the solvent soluble material. Some materials may swell during their removal in a manner which would cause the breaking of the delicate interconnection leads, whereas other materials do not readily accept an electroless plate. Still other materials may not form the desired smooth surface to define the sharp definition required for the interconnecting leads. A suitable solvent soluble bridging material must be easily applied, yield a smooth surface and be easily conditioned to be electrolessly plated with material such as copper or nickel. Furthermore, it should be easily removed, such as with trichloroethylene, and not swell during removal. There are various paraffins which are acceptable solvent soluble materials. In particular, a black wax manufactured by the James Biddle Company under the trade name "AZIEZON" is found to be quite useful. It is also found that certain plating resists can be used as the solvent soluble material.

It will be obvious to those skilled in the art that many modifications and variations can be made in the practice of the method of the present invention. For example, the solvent soluble material used as the base between the two substrates may be applied by a hot melt gun, or could be a preformed configuration placed between the substrates to be interconnected. Also, rather than separately plating the interconnecting leads, they can be plated at the same time that the circuits on the two substrates are plated, thus being a truly batch process. Furthermore, as discussed previously, many techniques of photolithography and etching, or photolithography and additive plating can be used to define the leads over the bridged solvent soluble material. In addition, once the interconnecting leads have been formed and the solvent soluble material is removed, it may be desirable to suitably anneal the leads to relieve any initial stresses therein.

It is, therefore, intended that the invention not be limited to the specifics of the foregoing descriptions of the preferred embodiments, but rather as to embrace the full scope of the following claims.

We claim:

1. A method for providing interconnections between respective sites on two adjacent substrates, comprising the steps of:
    placing a curved, non-swelling solvent soluble material between the respective interconnection sites on said adjacent substrates, said solvent soluble material having a smooth surface and being adapted to accept a plate of conductor material;
    defining a desired interconnection pattern on said solvent soluble material and the sites on said substrates;
    depositing a conductor material in the defined interconnection pattern to thereby establish the desired curved interconnecting leads between respective sites on said two adjacent substrates; and
    dissolving and removing the solvent soluble material, thereby leaving the curved interconnecting leads suspended between said two substrates, the curve in each lead providing stress relief thereto.

2. The method according to claim 1 wherein the curved surface of said solvent soluble material is concave.

3. The method according to claim 1 wherein the curved surface of said solvent soluble material is convex.

4. The method according to claim 1 wherein all steps are carried out in a temperature of less than 150° Centigrade.

5. The method according to claim 1 wherein said solvent soluble material is dissolved by immersion in a solvent chosen from the group consisting of methylene chloride and trichloroethylene.

6. A method for providing interconnections between respective sites on two adjacent substrates, comprising the steps of:
    placing a non-swelling solvent soluble material between the respective interconnection sites on said adjacent substrates, said solvent soluble material being shaped to provide a curved surface therebetween
    applying a photoresist over the solvent soluble material and said interconnection sites;

exposing said photoresist to define the desired interconnecting paths between the sites on said substrates;
developing said photoresist to define the desired interconnecting paths;
electrolessly plating copper in said areas defined by said photoresist to thereby provide the interconnecting leads between respective sites on said substrates;
removing said undeveloped photoresist; and
dissolving away the solvent soluble material from between said substrate.

* * * * *